(12) United States Patent
Jin et al.

(10) Patent No.: US 7,009,308 B1
(45) Date of Patent: Mar. 7, 2006

(54) METHODS AND APPARATUS FOR IMPROVING HIGH FREQUENCY INPUT/OUTPUT PERFORMANCE

(76) Inventors: Xiaodong Jin, 175 E. Homestead Rd., Apartment #23, Sunnyvale, CA (US) 94087; Lawrence Tse, 43345 Livermore Common, Fremont, CA (US) 94539; King Chun Tsai, 1849 Brixton Ct., San Jose, CA (US) 95132; George Chien, 1527 Poppy Way, Cupertino, CA (US) 95014; Shuran Wei, 1433 Bellemeade St., San Jose, CA (US) 95131

( * ) Notice: Subject to any disclaimer, the term of this patent is extended or adjusted under 35 U.S.C. 154(b) by 0 days.

(21) Appl. No.: 11/034,979

(22) Filed: Jan. 13, 2005

Related U.S. Application Data

(62) Division of application No. 10/397,402, filed on Mar. 26, 2003, now Pat. No. 6,911,739.

(60) Provisional application No. 60/443,373, filed on Jan. 29, 2003.

(51) Int. Cl.
H01L 23/49 (2006.01)

(52) U.S. Cl. .................. 257/786; 257/690; 257/784; 438/106

(58) Field of Classification Search ........... 257/690, 257/784, 786; 438/106
See application file for complete search history.

(56) References Cited

U.S. PATENT DOCUMENTS

| 4,113,996 | A | | 9/1978 | Sanderson |
|---|---|---|---|---|
| 4,605,980 | A | | 8/1986 | Hartranft et al. |
| 5,088,016 | A | * | 2/1992 | Vinciarelli et al. ........... 363/15 |
| 5,181,092 | A | | 1/1993 | Atsumi |
| 5,428,837 | A | | 6/1995 | Bayruns et al. |
| 5,546,038 | A | | 8/1996 | Croft |
| 5,854,504 | A | | 12/1998 | Consiglio |
| 5,965,920 | A | | 10/1999 | Sung |
| 6,081,164 | A | | 6/2000 | Shigemori et al. |
| 6,107,684 | A | | 8/2000 | Busking et al. |
| 6,208,225 | B1 | | 3/2001 | Miller |
| 6,218,706 | B1 | | 4/2001 | Waggoner et al. |
| 6,232,645 | B1 | | 5/2001 | Belot |
| 6,317,305 | B1 | | 11/2001 | Dedic |
| 6,355,970 | B1 | | 3/2002 | Fujii |
| 6,813,486 | B1 | * | 11/2004 | Sayers ........................ 455/338 |
| 2004/0012457 | A9 | * | 1/2004 | Soltan et al. .................. 333/33 |

OTHER PUBLICATIONS

U.S. Appl. No. 10/397,454, filed Mar. 26, 2003, Jin Xiaodong.

* cited by examiner

*Primary Examiner*—Allan R. Wilson
(74) *Attorney, Agent, or Firm*—Harness, Dickey & Pierce P.L.C.

(57) ABSTRACT

A circuit that eliminates an off-chip inductive component connected between an integrated circuit (IC) arranged on a package and an external load comprises a package and an IC that is arranged on the package. A first bondwire arranged on the package has one end that communicates with the external load and an opposite end that communicates with the IC. A second bondwire located on the package has one end that communicates with the external load and an opposite end that communicates with the IC.

8 Claims, 13 Drawing Sheets

METHODS AND APPARATUS FOR IMPROVING HIGH FREQUENCY INPUT/OUTPUT PERFORMANCE

CROSS-REFERENCE TO RELATED APPLICATIONS

This application is a divisional Application of U.S. patent application Ser. No. 10/397,402 filed on Mar. 26, 2003, now U.S. Pat. No. 6,911,739, which claims the benefit of U.S. Provisional Application No. 60/443,373, filed on Jan. 29, 2003. The disclosures of the above applications are incorporated herein by reference in its entirety.

FIELD OF THE INVENTION

The present invention relates to high frequency circuits, and more particularly to methods and apparatus for improving input/output performance of high frequency circuits.

BACKGROUND OF THE INVENTION

As data rates and operating frequencies of wired and wireless communications increase, advanced technologies must be used to keep up with the rising clock rates for wired communications and the rising carrier frequencies for wireless communications. Devices using advanced technologies generally possess a very high $f_t$, which is the frequency corresponding to an intrinsic transistor current gain of unity. In order to operate at high operating frequencies, these devices must have high transconductance and low input capacitance.

Complementary metal oxide semiconductor (CMOS) technology is typically used to implement these devices due to its relatively low cost and high level of integration. However, advanced CMOS devices typically have limited input capacitance. Therefore, circuits operating in these frequency ranges are very sensitive to parasitics, which are typically introduced by electrostatic discharge (ESD) protection circuits, bondwires and packages.

Bondwires provide connections between pins on the package and pads on the IC. Bondwires typically have a diameter of about 1.0~1.2 mils and an inductance of approximately 1 nH/mm. Typical bondwire lengths for a packaged pin are about 3 to 4 mm. These bondwires have an inductance of about 3–4 nH. At 2.4 GHz, bondwires present about 45–60 ohms of impedance in series with the input or output impedance, which may alter the input/output impedance characteristics of the IC. IC designs must account for this impedance.

Some integrated circuits may need to reject signal energy at a first frequency to meet design parameters. For example, receiver circuits typically include mixers that mix input signals at $f_1$ with a reference frequency $f_2$. The mixer outputs signals at $f_1-f_2$ and $f_2-f_3$, where $f_3$ is an image frequency. For example, the frequency $f_1$ can be approximately 2.4 GHz and the frequency $f_2$ can be approximately 2.1 GHz. The image frequency $f_3$ is approximately 1.8 GHz and the mixer output signal frequency is at approximately 300 MHz.

An external filter is typically used to remove the mixing output that occurs due to the image frequency to improve signal quality. As can be appreciated, other types of ICs may also need to reject signal energy at other frequencies. These circuits may require external filters or other external components to reject the signal energy at the frequencies. These external filters and other components increase the cost of these circuits.

Impedance matching networks are often used to maximize signal energy that is coupled from an IC to a load. The impedance matching network typically includes an inductor and a capacitor. The inductor and capacitor are typically implemented off-chip. As can be appreciated, reducing or eliminating the off-chip circuit elements would help to reduce the cost of the impedance matching network. Other circuits may include external resonant circuits, which include off-chip inductors and/or capacitors. As can be appreciated, the off-chip circuit elements increase the cost of these circuits.

SUMMARY OF THE INVENTION

An input circuit according to the present invention for an integrated circuit (IC), which is mounted on a package having a pin, rejects signal energy at a first frequency. A first bondwire located on the package has one end that communicates with the pin and an opposite end that communicates with the IC. A second bondwire arranged on the package has one end that communicates with the pin and an opposite end that communicates with a capacitance. The capacitance and an inductance of the first and second bondwires resonate at the first frequency to reject signal energy at the first frequency.

In other features, the capacitance is located on the IC. The capacitance is provided by at least one of a variable capacitor and a parasitic capacitance of an electrostatic discharge (ESD) protection circuit.

An impedance matching circuit according to the present invention for an IC arranged on a package matches an impedance of an external load. An impedance matching circuit includes a first bondwire arranged on the package that has one end that communicates with the external load and an opposite end that communicates with the IC. A capacitance is arranged on the IC. A second bondwire arranged on the package has one end that communicates with the external load and an opposite end that communicates with one end of the capacitance.

In other features, the package includes a pin and the IC includes first and second pads. The one end of the first bondwire communicates with the pin. The opposite end of the first bondwire communicates with the first pad. The one end of the second bondwire communicates with the pin. The opposite end of the second bondwire communicates with the second pad.

A circuit according to the present invention eliminates an external resonant component connected between an IC arranged on a package and an external load. A resonant circuit includes a capacitance located on the IC, a first bondwire is arranged on the package and has one end that communicates with the external load and an opposite end that communicates with the IC, and a second bondwire is arranged on the package and has one end that communicates with the external load and an opposite end that communicates with one end of the capacitance.

The package includes a pin and the IC includes first and second pads. The one end of the capacitance communicates with the second pad. The one end of the first bondwire communicates with the pin. The opposite end of the bondwire communicates with the first pad. The one end of the second bondwire communicates with the pin. The opposite end of the bondwire communicates with the second pad.

A circuit according to the present invention eliminates an off-chip inductive component connected between an IC arranged on a package and an external load. A first bondwire that is arranged on the package has one end that communicates with the external load and an opposite end that communicates with the IC. A second bondwire that is arranged on the package has one end that communicates with the external load and an opposite end that communicates with the IC.

The package includes a pin and the IC includes first and second pads. The one end of the first bondwire communicates with the pin. The opposite end of the first bondwire communicates with the first pad. The one end of the second bondwire communicates with the pin. An opposite end of the second bondwire communicates with the second pad.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1B:
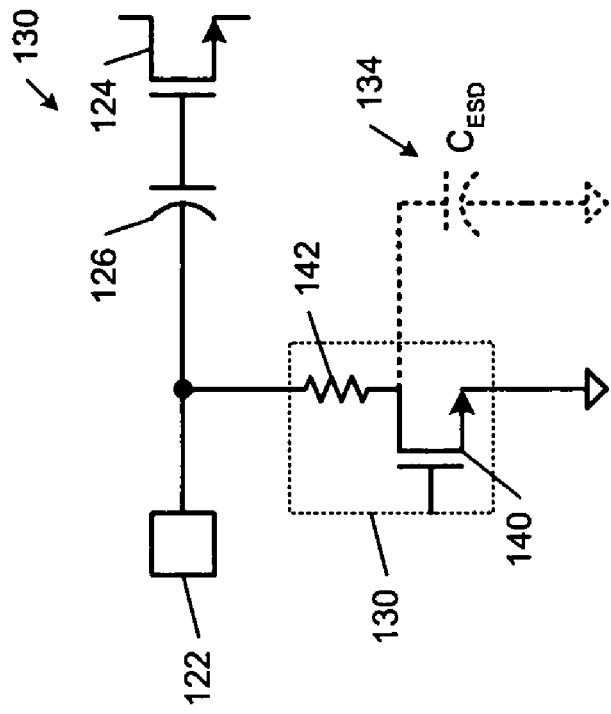
FIGS. 1A and 1B are electrical schematics of ICs with ESD protection circuits according to the prior art.

The following description of the preferred embodiment(s) is merely exemplary in nature and is in no way intended to limit the invention, its application, or uses. For purposes of clarity, the reference numbers will be used in the drawings to identify similar elements.

Figure 1A:
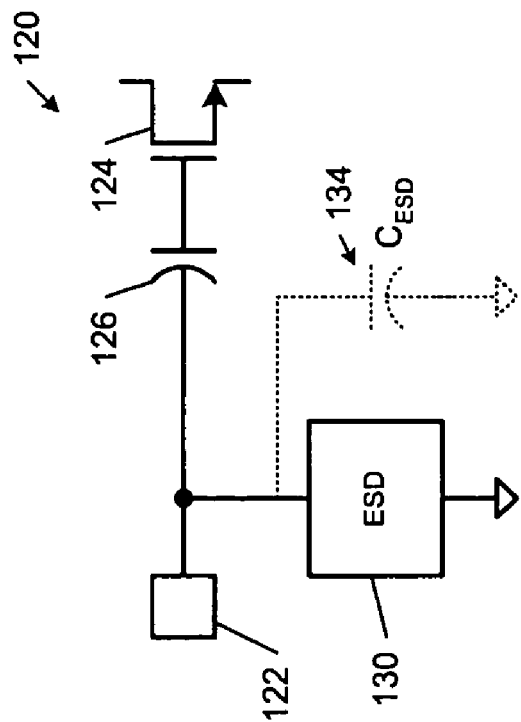

Referring now to FIG. 1A, an exemplary integrated circuit (IC) 120 is shown and includes an input pad 122, a low noise amplifier 124 and a blocking capacitor 126. While the IC 120 includes the low noise amplifier 124, the ESD protection circuit may be implemented in other types of circuits. In the embodiment illustrated in FIG. 1A, the low noise amplifier 124 is implemented using an n-channel CMOS transistor. An ESD protection circuit 130 protects the devices in the integrated circuit 120 from ESD voltages. Typically, the ESD protection circuit 130 has a high capacitance that is schematically illustrated at 134.

Referring now to FIG. 1B, an exemplary ESD protection circuit 130 is illustrated in detail and includes an ESD protection transistor 140 having a gate, a drain and a source as shown. The ESD protection transistor 140 typically has a drain extension that increases the capacitance $C_{ESD}$ 134. The increased drain area provided by the drain extension also has a drain resistance that is shown at 142. In the embodiment illustrated in FIG. 1B, the ESD protection transistor 140 is implemented using a CMOS transistor.

Figure 2B:
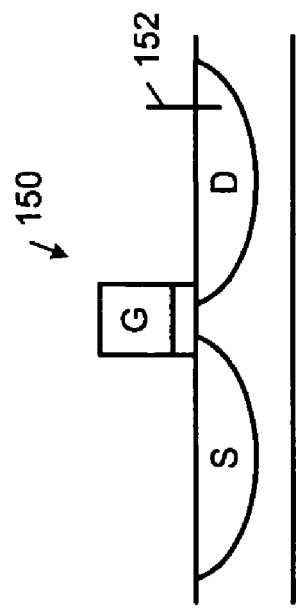
FIGS. 2A and 2B illustrate a conventional CMOS transistor including a gate, a source, and a drain according to the prior art.
Figure 2A:
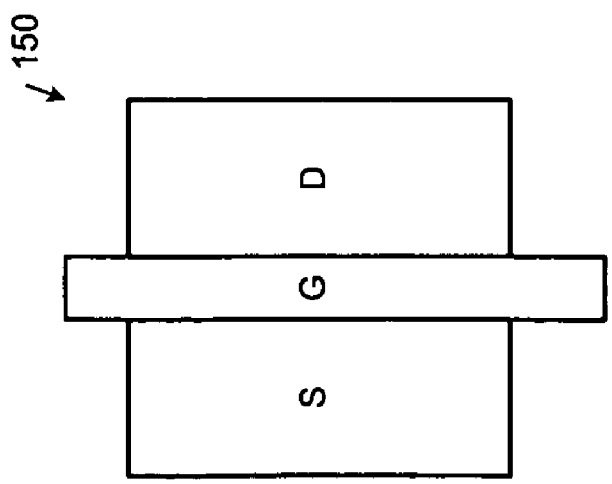

Referring now to FIGS. 2A and 2B, a conventional CMOS transistor 150 including a drain contact 152 is illustrated. Typically, the source and drain are doped and have approximately the same chip area. The gate is fabricated between the source and drain. One or more isolation areas (not shown) may be provided.

Figure 3B:
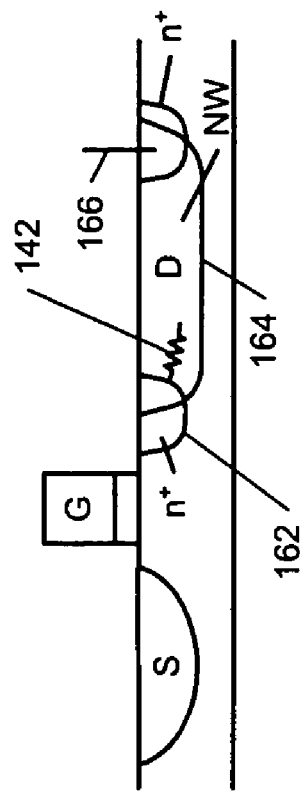
FIGS. 3A and 3B illustrate a CMOS transistor with a drain extension that is used in conventional ESD protection circuits according to the prior art.
Figure 3A:
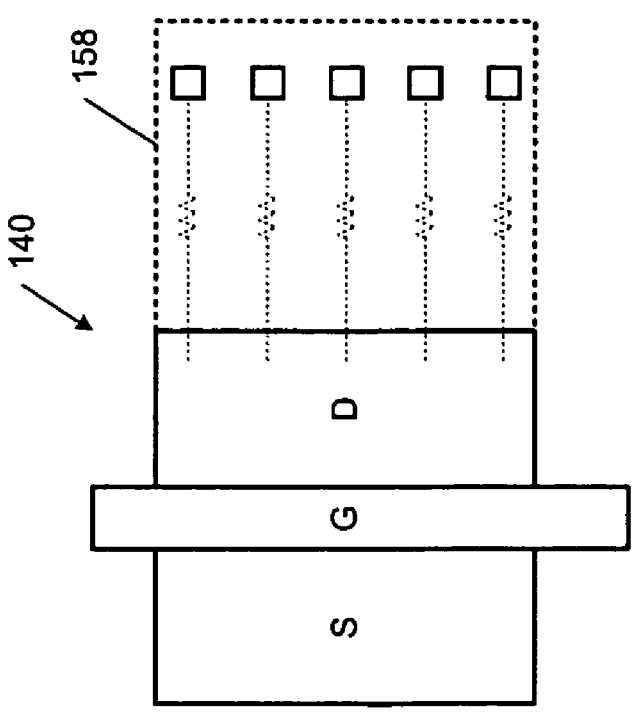

Referring now to FIGS. 3A and 3B, the extended drain ESD protection transistor 140 that is used in the ESD protection circuit 130 is illustrated in further detail. The drain area is extended as shown by dotted lines 158 in FIG. 3A. Typically the drain extension is at least 2–3 times the minimum drain width permitted by the foundry process that is used. Drain extensions that are 10–15 times the minimum drain width have also been used. In FIG. 3B, the drain resistance 142 is created between an n+ doped region 162 and a n-type well (NW) region 164. A drain contact 166 is located in the NW region 64.

The increased drain area substantially increases the capacitance $C_{ESD}$. A typical value for $C_{ESD}$ using this approach is 1.5 pF for a 3 kV rating. The increased capacitance $C_{ESD}$ also increases the noise that is contributed by the ESD protection circuit 130. As $C_{ESD}$ increases, coupling of the noise increases. The increased noise contribution of the ESD protection circuit 130 adversely impacts the operation of the transceiver. For example, the increased noise is amplified by the low noise amplifier 124 in wireless transceivers.

Figure 4B:
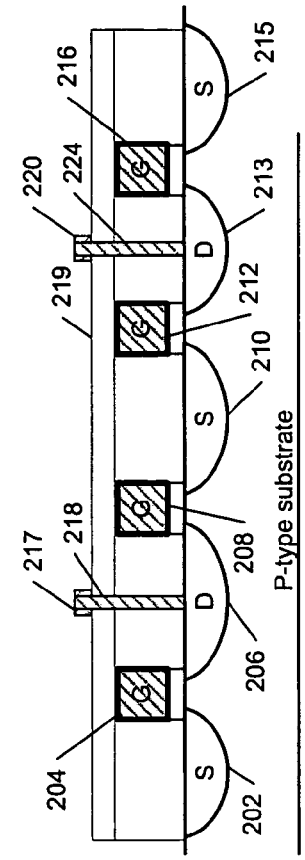
FIG. 4B is a cross sectional view of FIG. 4A.
Figure 4A:
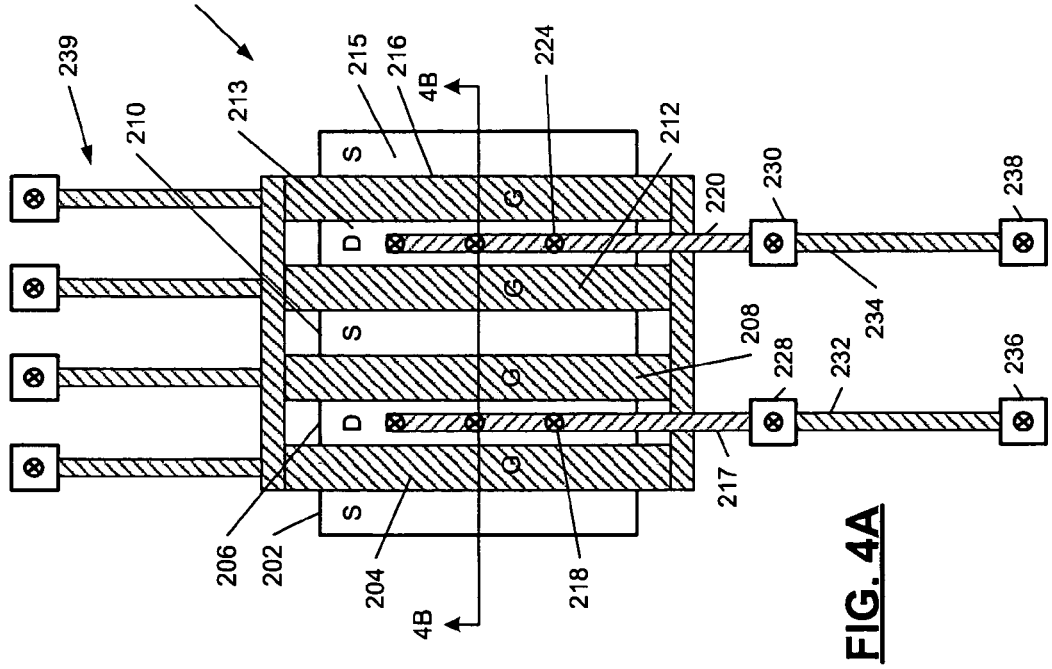
FIG. 4A is a plan view of an ESD protection circuit according to the present invention.

Referring now to FIGS. 4A and 4B, the ESD protection transistor 140 in the ESD protection circuit 130 in FIG. 1B is replaced by an ESD protection circuit 200 according to the present invention. The ESD protection circuit 200 can include one or more transistors. The exemplary ESD protection circuit 200 in FIGS. 4A and 4B includes four transistors. A first transistor includes a first source 202, a gate 204 and a first drain 206. A second transistor includes the first drain 206, a second gate 208 and a second source 210. A third transistor includes the second source 210, a third gate 212 and a second drain 213. A fourth transistor includes the second drain 213, a third source 215 and a fourth gate 216. The circuit 200 includes four gates or fingers that are connected together and that are defined in a poly silicon layer. Additional and/or fewer gates or fingers can be employed.

A metal layer 217, which is located above the poly silicon layer, is connected by one or more vias to the drain 206. An insulating layer 219 separates the metal layer 216 and the poly silicon layer defining the gates. A metal layer 220 is connected by one of more vias 224 to the drain 213. The metal layers 217 and 220 are connected to contacts 228 and 230. The contacts 228 and 230 are connected by poly resistors 232 and 234 to contacts 236 and 238. The contacts 236 and 238 are connected to the input pad and/or transistors of the IC. One or more gate contacts 239 provide connections to the gate(s) of ESD protection circuit 200.

As can be appreciated by skilled artisans, the exemplary implementation shown in FIG. 4A includes four transistors that share drains (2) to reduce drain capacitance and sources (3) to reduce chip area. An acceptable alternative would be to include one or more transistors each having a dedicated source, gate and drain. Still other variations will be apparent to skilled artisans.

More generally, the ESD protection circuit includes n transistors with n gates and at least n/2 drains. At least n/2 poly silicon resistors have one end that communicates with corresponding ones of at least n/2 contacts and an opposite end that communicates with corresponding ones of the at least n/2 drains (through one or more metal layers and vias).

The drains 206 and 213 have the minimum drain areas (based on layout rules of the foundry process that is used) such that the drain capacitance $C_{ESD}$ is largely reduced. For example, drains formed using a 0.13 micron process may have a width that is somewhat greater than 0.13 microns to allow room for pin contacts.

According to the prior art extended drain method, the drain extension is at least 2 or 3 times the minimum drain width. The corresponding capacitance $C_{ESD}$ of the ESD protection circuit according to the prior art are approximately 1 to 2 pF with 1.5 kV and 2 kV ratings, respectively. A 3 kV rating would have a capacitance $C_{ESD}$ of 1.5 pF. In contrast, the ESD protection circuit 200 has a capacitance that is substantially less than one-half of the prior art extended drain method for devices having the same number of fingers or gates and discharge voltage ratings. For example, the ESD protection circuit 200 depicted in FIG. 4A with a rating of 3 kV has a capacitance $C_{ESD}$ of 0.5 pF for a 0.13 micron process, which is one third of the prior art extended drain capacitance.

The ESD protection circuit 200 according to the present invention reduces the parasitic capacitance $C_{ESD}$ of the ESD protection circuit during operation. Other benefits include reducing the noise contribution from substrate resistance during normal operation due to the reduction of parasitic capacitance $C_{ESD}$.

Figure 4C:
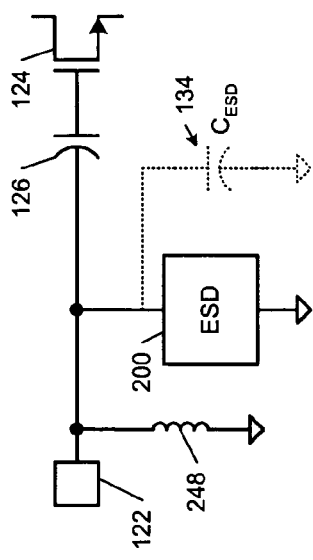
FIG. 4C illustrates the ESD protection circuit of FIG. 4A with a parallel on-chip spiral inductor.

Referring now to FIG. 4C, an on chip spiral inductor 248 can also be connected in parallel to the ESD protection circuit 200. The inductance of the on chip spiral inductor 248 is chosen to resonate at the signal frequency with the ESD protection circuit 200 and other parasitic capacitances. The admittance of inductor is 1/jwL. The admittance of the capacitance is jwC. Therefore, the total admittance of the tuned circuit is close to zero at the resonant frequency. In other words, the impedance of the tank is very large and is mainly depend of the Q of LC tank.

Figure 4D:
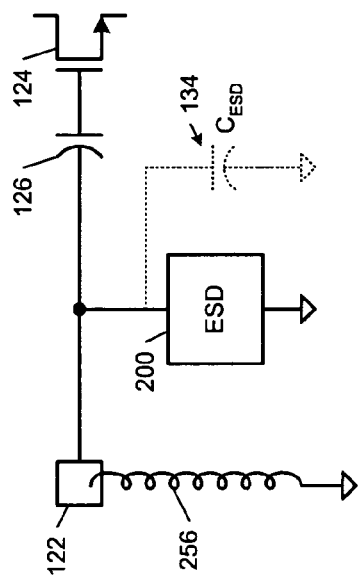
FIG. 4D illustrates the ESD protection circuit of FIG. 4A with a parallel bondwire inductor.

Referring now to FIG. 4D, the on chip spiral inductor 248 can be replaced by bondwire 256. For example, additional bondwire is bonded from the pad 122 (or pads if several pads are connected together) to ground and will resonant with the ESD protection circuit 200 and other parasitic capacitances. By utilizing the inductance of the spiral inductor 248 or the bondwire 256, as described above, matching networks can be constructed in the input/output to filter out the unwanted signals (noise). For example, the matching network rejects signal energy at the image frequency in receiver applications. The matching network can also be used to reject energy at other frequencies in other circuits.

Figure 5:
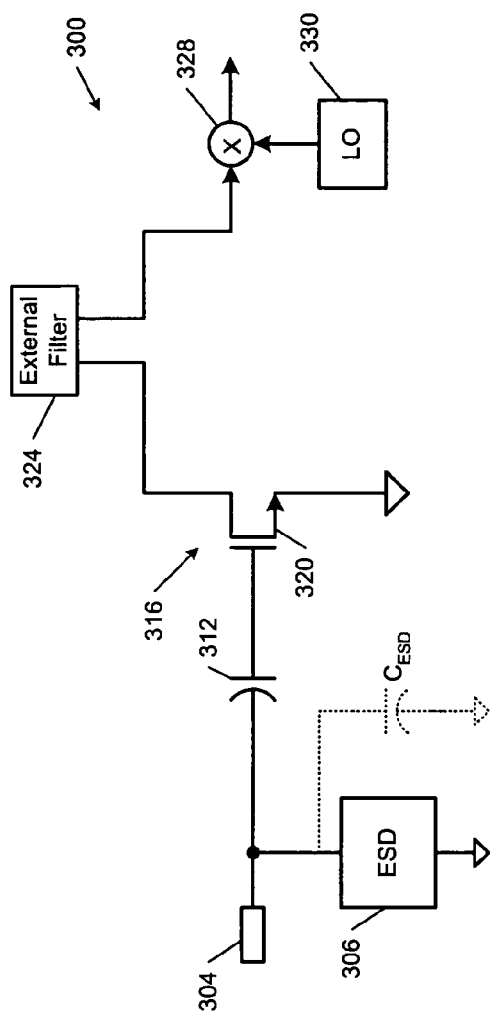
FIG. 5 illustrates an ESD protection circuit that is connected between an input pad and a blocking capacitor in a transceiver IC according to the prior art.

Referring now to FIG. 5, a receiver circuit 300 includes an input pin 304 that communicates with an ESD protection circuit 306 and a blocking capacitor 312. The blocking capacitor 312 communicates with a low noise amplifier 316, which can be implemented by a CMOS transistor 320. A drain of the transistor 320 is coupled to an external filter 324 to filter an image frequency. An output of the external filter 324 is input to a mixer 328. A local oscillator 330 is also input to the mixer 328.

Figure 6:
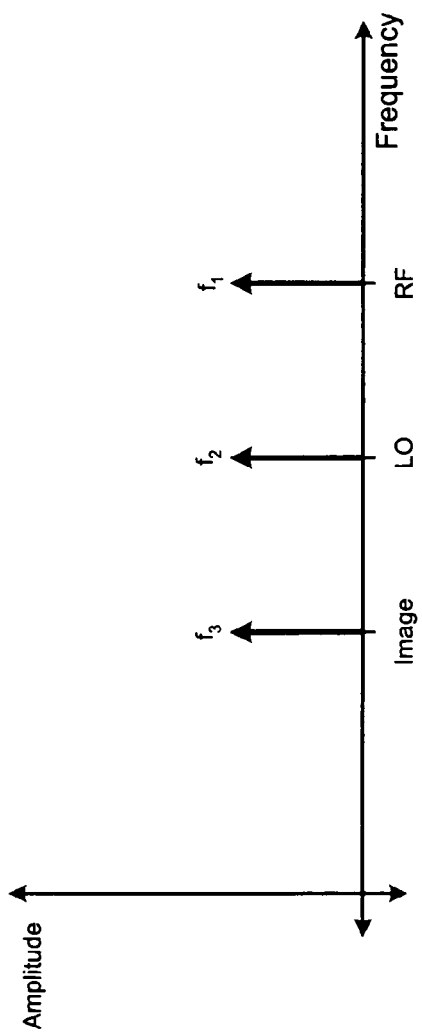
FIG. 6 illustrates an image frequency that is produced during mixing in the transceiver IC of FIG. 5 according to the prior art.

Referring now to FIG. 6, an exemplary radio frequency (RF) signal at a first frequency $f_1$ is received at the input pin 304. The local oscillator 330 typically operates at a second frequency $f_2$. The mixer 328 combines the RF signal at $f_1$ with the local oscillator signal at $f_2$ to produce an intermediate frequency (IF) signal. The mixer 328 outputs signals at $f_1-f_2$ and $f_2-f_3$. For example, the frequency $f_1$ is approximately 2.4 GHz. For example, the frequency $f_2$ is approximately 2.1 GHz. In this example, the image frequency $f_3$ would be approximately 1.8 GHz and the IF signal is at 300 MHz. The external filter 324 is typically used to remove the mixing output that occurs due to the image frequency.

Figure 7:
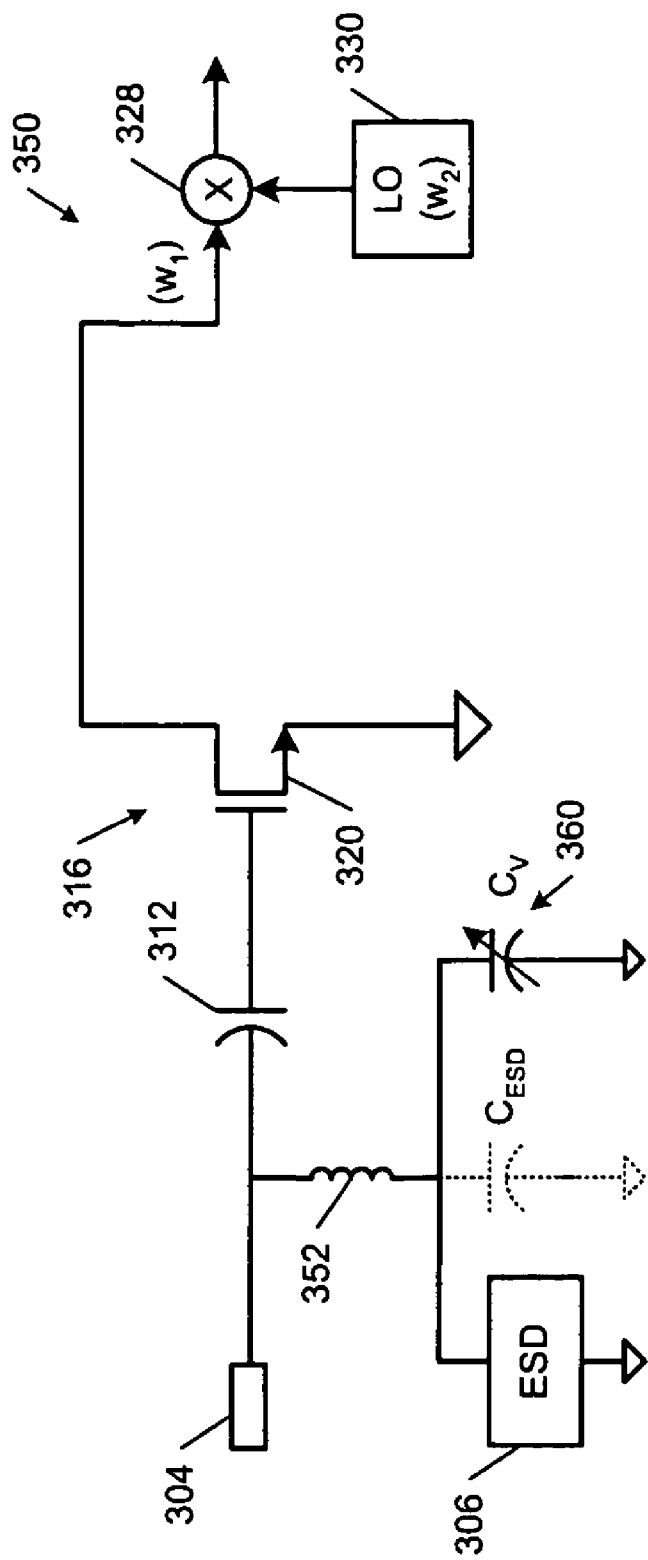
FIG. 7 illustrates an ESD protection circuit that includes a variable capacitor and an inductor and that rejects signal energy at a first frequency.

Referring now to FIG. 7, an improved receiver circuit 350 according to the present invention can be implemented on chip. Rejection of the image frequency is performed along with the ESD function. While the receiver circuit 350 is shown, the present invention may be used with any circuit requiring rejection of a first frequency. More particularly, the input pin 304 is coupled to one end of an inductor 352. An opposite end of the inductor 352 is coupled to the ESD protection circuit 306 and to a capacitor 360, which can be a fixed or variable capacitor. As can be appreciated, the conventional ESD protection circuit 306 can be replaced by the ESD protection circuit 200 of FIG. 4A. Alternatively, the ESD circuit can be replaced by a capacitor for circuits that do not require ESD protection. If a variable capacitor is used, tuning can be performed. The inductance of the inductor 352 and the capacitance of the capacitor 360 (in combination with $C_{ESD}$) are selected to resonate at the image frequency, which provides a very low impedance or a short circuit at the image frequency.

Figure 9:
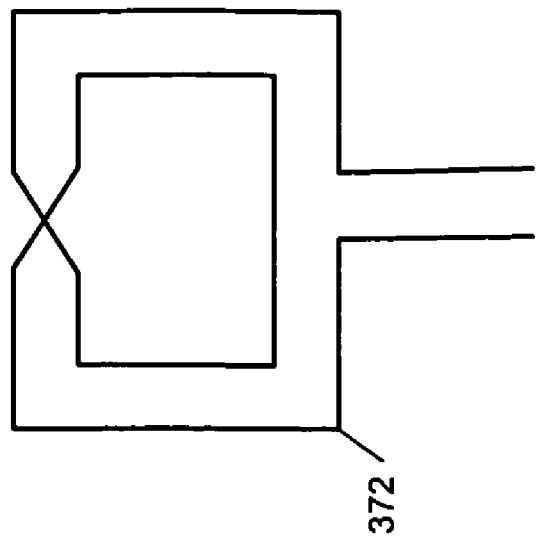
FIGS. 8 and 9 illustrate exemplary on-chip inductors.
Figure 8:
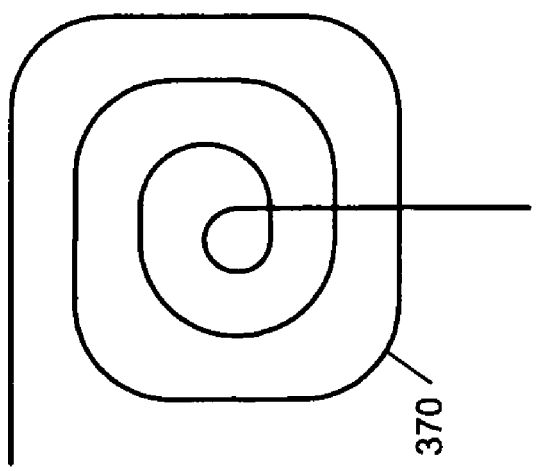

Referring now to FIGS. 8 and 9, the inductor 352 can be implemented on-chip. In FIG. 8, a spiral inductor 370 is shown. In FIG. 9, an asymmetric inductor 372 is shown. Skilled artisans will appreciate that other inductor implementations may be used without departing from the invention.

Figure 10:
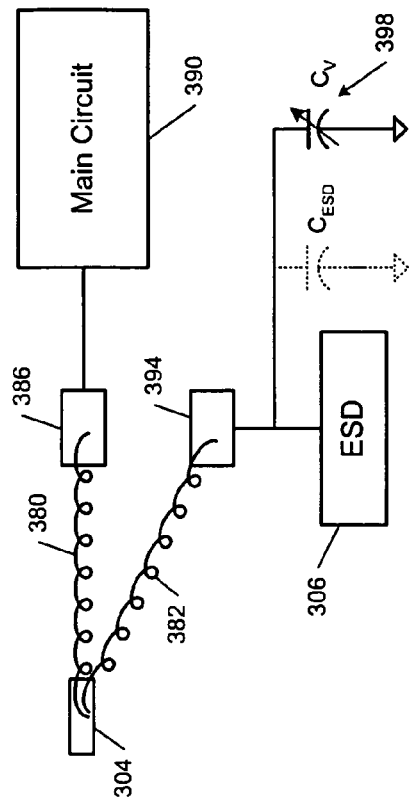
FIG. 10 illustrates an ESD protection circuit that employs a variable capacitor and a bondwire inductor.
Figure 11:
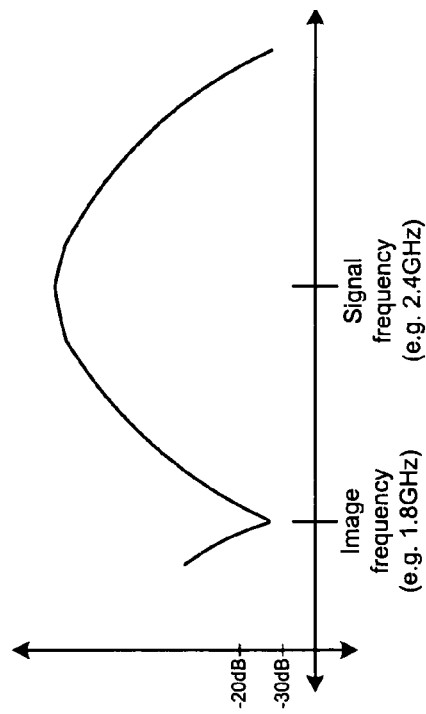
FIG. 11 illustrates a frequency domain for the ESD protection circuits of FIGS. 7 and 10.

Referring now to FIG. 10, the inductance can also be provided by a bondwire pair 380 and 382. The bondwire 380 connects the input pin 304 to a pad 386. The pad 386 is connected to a main circuit 390, which may include a low noise amplifier. The bondwire 382 connects the input pin 304 to a pad 394. The ESD protection circuit 306 (which forms part of the IC) and a capacitor 398, which can be a variable capacitor, are connected to the pad 394. As can be appreciated, the ESD protection circuit 306 can be replaced by the ESD protection circuit 200 of FIG. 4A. FIG. 11 shows the frequency domain response of the circuit of FIG. 10, which has excellent rejection at the image frequency or other frequency. While the ESD protection circuit of the present invention have been described in conjunction with ESD protection of input pads, skilled artisans will appreciate that the ESD protection circuits can be used to protect output pads as well.

Figure 12:
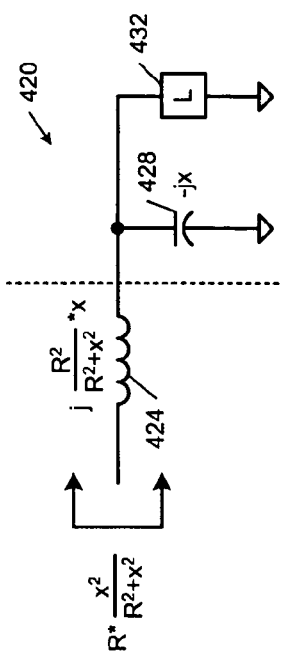
FIG. 12 illustrates an IC, a package and an impedance matching network including an external capacitor according to the prior art for an IC.

The spiral inductor and/or bondwire can be used to construct a matching network, which usually requires external matching components. Referring now to FIG. 12, an impedance matching network according to the prior art is shown at 420. An inductance 424 is typically implemented on-chip, for example using inductors illustrated in FIGS. 8 and 9. A capacitor 428 and a resistor (R) 432 are typically implemented off-chip, which increases the cost of the impedance matching network 420. The impedance of the impedance matching network is:

$$R * \frac{x^2}{R^2 + x^2}$$

where the inductance of the inductor 424 is:

$$j * \frac{R^2}{R^2 + x^2} * x$$

and the capacitance is −jx.

Figure 13:
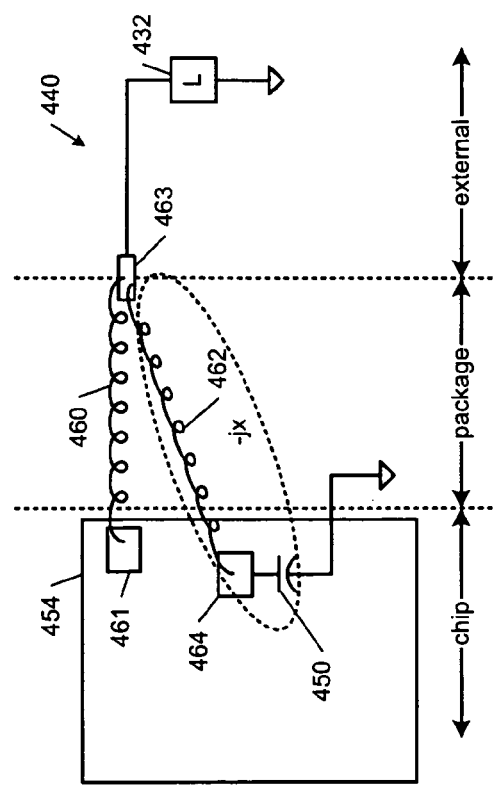
FIG. 13 illustrates an IC, a package and an impedance matching network that eliminates the external capacitor of FIG. 12 according to the present invention.

Referring now to FIG. 13, an impedance matching network 440 according to the present invention is shown. The off-chip capacitor 428 is brought on-chip according to the present invention to reduce cost. A capacitor 450 is implemented on a chip 454. A bondwire pair including bondwire 460 and 462 are used to provide the inductance.

The bondwire 460 has one end that is connected to an output pad 461 of the chip 454 and an opposite end that is connected by the pin 463 to the external load 432. The bondwire 462 has one end that is connected to an output pad 464 of the chip 454 and the on-chip capacitor 450 and an opposite end that is connected to the pin 463. An opposite end of the capacitor 450 is connected to ground, which may be located on-chip or on the package. The combined impedance of the capacitor 450 and the bondwire 462 is set equal to −jx. As a result, the impedance matching network 440 of FIG. 13 is equivalent to the impedance matching network 420 of FIG. 12.

Figure 14:
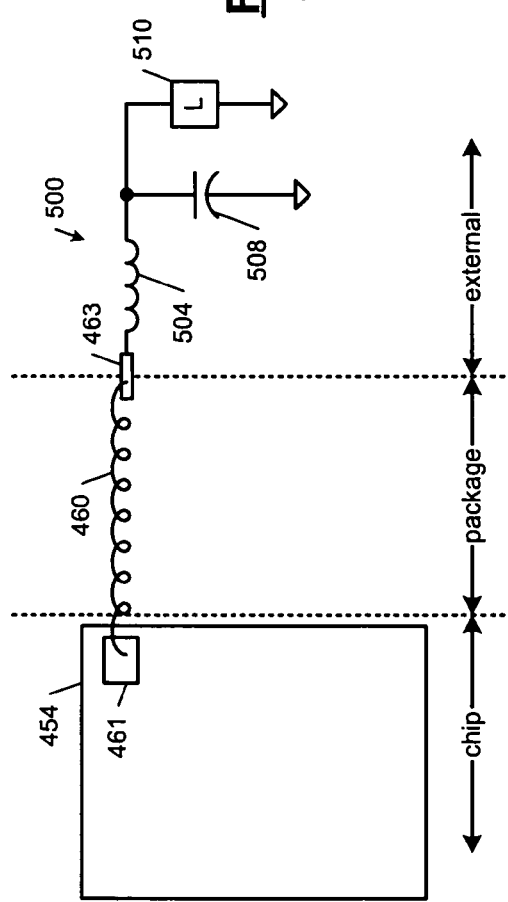
FIG. 14 illustrates an IC, a package and external components including a parallel capacitor and a series inductor according to the prior art.
Figure 15:
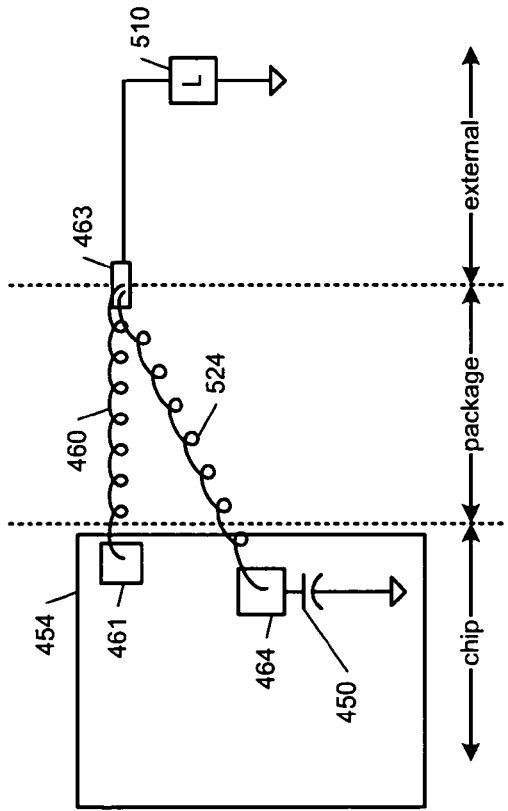
FIG. 15 illustrates an IC, and a package that eliminates the external parallel capacitor and the external series inductance in FIG. 14 according to the present invention.

In FIG. 14, an external LC circuit 500 includes an external inductor 504 and an external capacitor 508 that are connected to the output pin 463. A load generally identified at 510 is connected to the LC circuit 500. The bondwire 460 connects the pin 463 to the pad 461 on the chip 454. Referring now to FIG. 15, to reduce costs, bondwires 460 and 524 that are located on the package and the capacitance 450 that is located on the chip 454 are used to replace the inductor 504 and the capacitor 508 and to provide an equivalent circuit.

Figure 16:
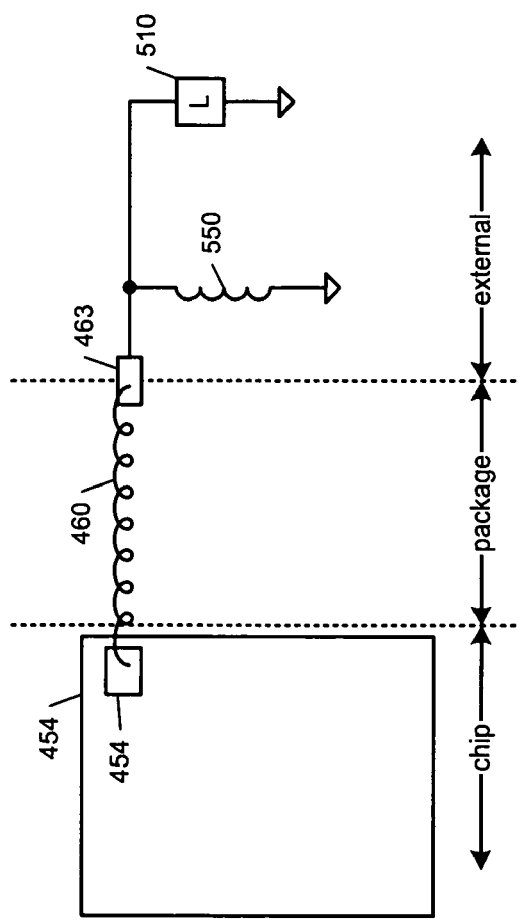
FIG. 16 illustrates an IC, a package and external components including a parallel inductor according to the prior art.
Figure 17:
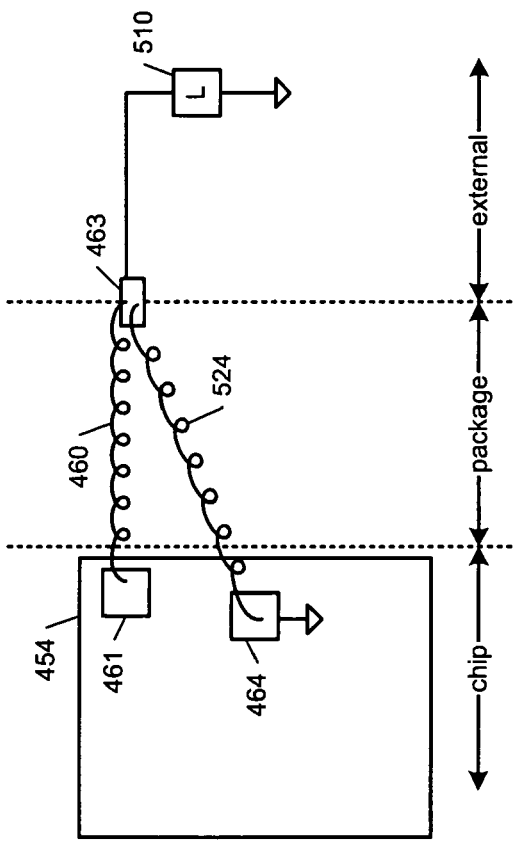
FIG. 17 illustrates an IC, and a package that eliminates the external parallel inductor in FIG. 16 according to the present invention.

In FIG. 16, an external parallel inductor 550 is connected to the output pin 463. The bondwire 460 connects the pin 463 to the pad 461 on the chip 454. Referring now to FIG. 17, to reduce costs, bondwires 460 and 524 that are located on the package are used to replace the inductor 550 and to provide an equivalent circuit.

Figure 18:
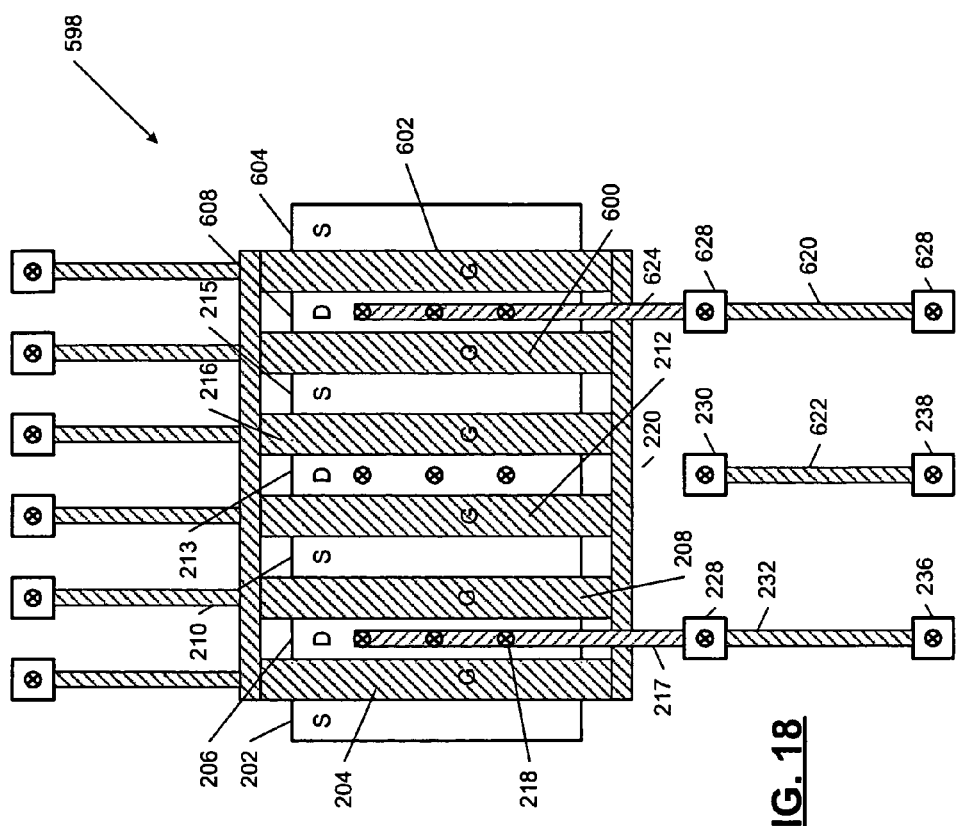
FIG. 18 is a plan view of an alternate ESD protection circuit according to the present invention that includes one or more resistors that can be connected after fabrication to adjust $C_{ESD}$.

Referring now to FIG. 18, an ESD circuit 598 that is similar to the ESD circuit in FIG. 4A is shown. The ESD circuit 598 includes additional gates 600 and 602, source(s) 604 and drain(s) 608 as shown. During fabrication, less that all of the resistors are connected. After fabrication, zero, one or more additional resistors can be connected as needed using post fabrication metal layers, traces or other connections. The ESD circuit 598 can be tuned to provide a minimum $C_{ESD}$ that meets a desired voltage rating.

For example, the ESD circuit 598 includes three drains is shown in FIG. 18. The resistor 232 is connected during processing using the metal interconnect layers and/or after fabrication using metal layers or traces formed over a passivation layer. One or more additional resistors such as resistors 620 and 622 may be selectively connected to the drains 608 and/or 213, respectively, after fabrication using metal layers or traces formed over the passivation layer. For example, the resistor 620 has opposite ends that are connected to contacts 626 and 628. A metal trace or layer 624 is added to connect the contact 628 to the drain 608. The resistor 622 can also be selectively connected in a similar manner.

As can be appreciated, with three drains, any combination of the resistors 232, 620 and 622 can be connected before and/or after fabrication. In other words, any one, two or three of the resistors can be connected. In addition, the technique according to the present invention can be used in ESD circuits having two or more drains. Still other variations will be apparent to skilled artisans.

In addition to providing a minimum $C_{ESD}$ for a particular voltage rating, the ESD circuit has additional advantages. For example, when spacing is provided by a disconnected resistor between two connected resistors, the ESD protection circuit has improved heat dissipation characteristics.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A circuit that eliminates an off-chip inductive component connected between an integrated circuit (IC) arranged on a package and an external load, comprising:
    a package;
    an IC that is arranged on said package;
    a first bondwire arranged on said package having one end that communicates with the external load and an opposite end that communicates with said IC; and
    a second bondwire arranged on said package that has one end that communicates with the external load and an opposite end that communicates with said IC.

2. The circuit of claim 1 wherein said package includes a pin, said IC includes first and second pads, said one end of said first bondwire communicates with said pin, said opposite end of said first bondwire communicates with said first pad, said one end of said second bondwire communicates with said pin, and an opposite end of said second bondwire communicates with said second pad.

3. A circuit that eliminates an off-chip inductive component connected between an integrated circuit (IC) arranged on a package and an external load, comprising:
- a package;
- an IC that is arranged on said package;
- first bondwire means for providing a connection, that is arranged on said package and that has one end that communicates with the external load and an opposite end that communicates with said IC; and
- second bondwire means for providing a connection, that is arranged on said package and that has one end that communicates with the external load and an opposite end that communicates with said IC.

4. The circuit of claim 3 wherein said package includes a pin, said IC includes first and second pads, and said one end of said first bondwire means communicates with said pin.

5. The circuit of claim 4 wherein said opposite end of said first bondwire means communicates with said first pad, said one end of said second bondwire means communicates with said pin, and an opposite end of said second bondwire means communicates with said second pad.

6. A method for eliminating an off-chip inductive component connected between an integrated circuit (IC) arranged on a package and an external load, comprising:
- providing an IC that is arranged on a package;
- arranging a first bondwire on said package with one end communicating with the external load and an opposite end communicating with said IC; and
- arranging a second bondwire on said package with one end communicating with the external load and an opposite end communicating with said IC.

7. The method of claim 6 wherein said package includes a pin and said IC includes first and second pads, and further comprising connecting said one end of said first bondwire means to said pin.

8. The method of claim 7 further comprising connecting said opposite end of said first bondwire means to said first pad, said one end of said second bondwire means to said pin, and an opposite end of said second bondwire means to said second pad.

* * * * *

UNITED STATES PATENT AND TRADEMARK OFFICE
CERTIFICATE OF CORRECTION

PATENT NO.         : 7,009,308 B1                                           Page 1 of 1
APPLICATION NO. : 11/034979
DATED              : March 7, 2006
INVENTOR(S)        : Xiaodong Jin et al.

It is certified that error appears in the above-identified patent and that said Letters Patent is hereby corrected as shown below:

Column 6, Line 5:          Delete "depend" and insert --dependent--
Column 6, Line 9:          Delete "resonant" and insert --resonate--
Column 8, Line 8:          Delete "that" and insert --than--
Column 8, Line 14:         Delete "is" and insert --as--

Signed and Sealed this

Twelfth Day of December, 2006

JON W. DUDAS
*Director of the United States Patent and Trademark Office*